US012615770B2

(12) United States Patent
Lin

(10) Patent No.: US 12,615,770 B2
(45) Date of Patent: Apr. 28, 2026

(54) SEMICONDUCTOR DEVICE AND METHOD OF FORMING THE SAME

(71) Applicant: Winbond Electronics Corp., Taichung City (TW)

(72) Inventor: Yu-Chi Lin, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 749 days.

(21) Appl. No.: 17/407,152

(22) Filed: Aug. 19, 2021

(65) Prior Publication Data

US 2022/0302145 A1    Sep. 22, 2022

(30) Foreign Application Priority Data

Mar. 17, 2021    (TW) ................................. 110109540

(51) Int. Cl.
H10B 41/30       (2023.01)
G11C 7/18        (2006.01)
(Continued)

(52) U.S. Cl.
CPC ............... H10B 41/30 (2023.02); G11C 7/18 (2013.01); H10B 41/10 (2023.02)

(58) Field of Classification Search
CPC ......... H01L 21/76813; H01L 21/76816; H01L 21/76804; H01L 21/76831
See application file for complete search history.

(56) References Cited

U.S. PATENT DOCUMENTS

| | | | | |
|---|---|---|---|---|
| 6,583,047 B2 * | 6/2003 | Daniels | ............. | H01L 21/76826 |
| | | | | 438/634 |
| 2002/0081834 A1 * | 6/2002 | Daniels | ............. | H01L 21/76828 |
| | | | | 438/634 |

(Continued)

FOREIGN PATENT DOCUMENTS

| | | |
|---|---|---|
| CN | 1493087 | 4/2004 |
| CN | 1702883 | 11/2005 |

(Continued)

OTHER PUBLICATIONS

"Office Action of Taiwan Counterpart Application", issued on Oct. 5, 2021, p. 1-p. 6.

(Continued)

*Primary Examiner* — Monica D Harrison
*Assistant Examiner* — Moataz Khalifa
(74) *Attorney, Agent, or Firm* — JCIPRNET

(57)              ABSTRACT

The embodiments of the invention provide a semiconductor device including a substrate, a gate, a source/drain region, a first dielectric layer, an etching stop layer, a second dielectric layer, an additional dielectric layer, a conductive contact and a bit line. The gate is disposed on the substrate. The source/drain region is disposed in the substrate and on a side of the gate. The first dielectric layer is disposed on the gate. The etching stop layer is disposed on the first dielectric layer. The second dielectric layer is disposed on the etching stop layer. The additional dielectric layer is disposed in the second dielectric layer and the etching stop layer. The conductive contact penetrates through the first dielectric layer and is electrically connected to the source/drain region. The bit line penetrates through second dielectric layer, the etching stop layer and the additional dielectric layer to electrically connect to the conductive contact.

14 Claims, 9 Drawing Sheets

500

(51) Int. Cl.
| | | |
|---|---|---|
| *H10B 41/10* | (2023.01) | |
| *H10B 41/35* | (2023.01) | |
| *H10B 43/10* | (2023.01) | |
| *H10B 43/35* | (2023.01) | |

(56)          References Cited

U.S. PATENT DOCUMENTS

| | | | |
|---|---|---|---|
| 2016/0111326 A1 | 4/2016 | Ohori et al. | |
| 2016/0126130 A1 | 5/2016 | Takahashi et al. | |
| 2016/0126179 A1 | 5/2016 | Takahashi et al. | |
| 2016/0204059 A1 | 7/2016 | Fukuo et al. | |
| 2020/0027780 A1* | 1/2020 | Briggs | H01L 21/76879 |
| 2020/0365451 A1* | 11/2020 | Tien | H01L 21/76811 |

FOREIGN PATENT DOCUMENTS

| | | |
|---|---|---|
| CN | 104867967 | 8/2015 |
| CN | 111129123 | 5/2020 |
| TW | 359873 | 6/1999 |
| TW | 200901371 | 1/2009 |
| TW | 201104795 | 2/2011 |
| TW | 201426912 | 7/2014 |

OTHER PUBLICATIONS

"Office Action of Taiwan Counterpart Application", issued on Feb. 16, 2023, p. 1-p. 9.
"Office Action of China Counterpart Application", issued on Apr. 30, 2024, p. 1-p. 7.

\* cited by examiner

SEMICONDUCTOR DEVICE AND METHOD OF FORMING THE SAME

CROSS-REFERENCE TO RELATED APPLICATION

This application claims the priority benefit of Taiwan application serial no. 110109540, filed on Mar. 17, 2021. The entirety of the above-mentioned patent application is hereby incorporated by reference herein and made a part of this specification.

BACKGROUND

Technical Field

The embodiment of the disclosure relates to a semiconductor device and method of forming the same.

Description of Related Art

The flash memory device has bit lines and conductive contacts. The bit line is overlying the conductive contact and electrically coupled to a source/drain region of a select gate through the conductive contact. Generally, the top width of the conductive contact is formed to be larger than the bottom width of the bit line, to facilitate the alignment and landing of the bit line on the conductive contact. However, as the size of the flash memory design continues to shrink, short circuit is easily to occur between the conductive contact and a bit line adjacent to the bit line overlying the conductive contact. Therefore, how to avoid or reduce the short circuit issue between the conductive contact and the bit line has become an urgent problem to be solved in this field.

SUMMARY

The embodiments of the disclosure provide a semiconductor device, which includes a substrate, a gate, a source/drain region, a first dielectric layer, an etching stop layer, a second dielectric layer, an additional dielectric layer, a conductive contact, and a bit line. The gate is located on the substrate. The source/drain region is disposed in the substrate and located on a side of the gate. The first dielectric layer is located over the gate. The etching stop layer is located on the first dielectric layer. The second dielectric layer is located on the etching stop layer. The additional dielectric layer is located in the second dielectric layer and the etching stop layer. The conductive contact penetrates through the first dielectric layer and is electrically connected to the source/drain region. The bit line penetrates through the second dielectric layer, the etching stop layer and the additional dielectric layer, and is electrically connected to the conductive contact.

The embodiments of the disclosure provide a method for forming a semiconductor device, which includes: forming a first dielectric layer; forming an etching stop layer on the first dielectric layer; forming a second dielectric layer on the etching stop layer; patterning the second dielectric layer and the etching stop layer to form an opening in the second dielectric layer and the etching stop layer; forming an additional dielectric layer in the opening; forming a patterned mask layer on the second dielectric layer and the additional dielectric layer; performing an etching process according to the patterned mask layer, so as to remove portions of the second dielectric layer, the additional dielectric layer, the etching stop layer, and the first dielectric layer, and a bit line trench and a via hole are formed; removing the patterned mask layer; and filling a conductive material in the bit line trench and the via hole, so as to form a bit line in the bit line trench and a conductive contact in the via hole.

In view of above, in the disclosure, a bit line trench and a via hole are simultaneously formed in the dielectric layer and the etching stop layer through forming an opening in the etching stop layer sandwiched in the dielectric layer and filling the opening within a dielectric material, and then performing one etching process. Afterwards, a conductive material is formed in the bit line trench and the via hole to simultaneously form the bit line and the conductive contact. Through this method, the formed conductive contact and the bit line are self-aligned, and the top width of the conductive contact is not greater than the bottom width of the bit line. Therefore, the short circuit issue between the conductive contact and other bit lines that is adjacent to the bit line overlying the conductive contact may be avoided.

BRIEF DESCRIPTION OF THE DRAWINGS

FIG. 3 to FIGS. 8A and 8B illustrate cross-sectional views and corresponding plan views or top views of multiple intermediate stages in a manufacturing method of bit lines and conductive contacts of a semiconductor device according to some embodiments of the disclosure. FIGS. 4B, 5B, 7B, and 8B are plan views along line A-A' of FIGS. 4A, 5A, 7A and 8A, respectively, and FIGS. 4A, 5A, 7A, and 8A are cross-sectional views taken along lines B-B' of FIGS. 4B, 5B, 7B, and 8B, respectively.

DESCRIPTION OF THE EMBODIMENTS

Figure 1:
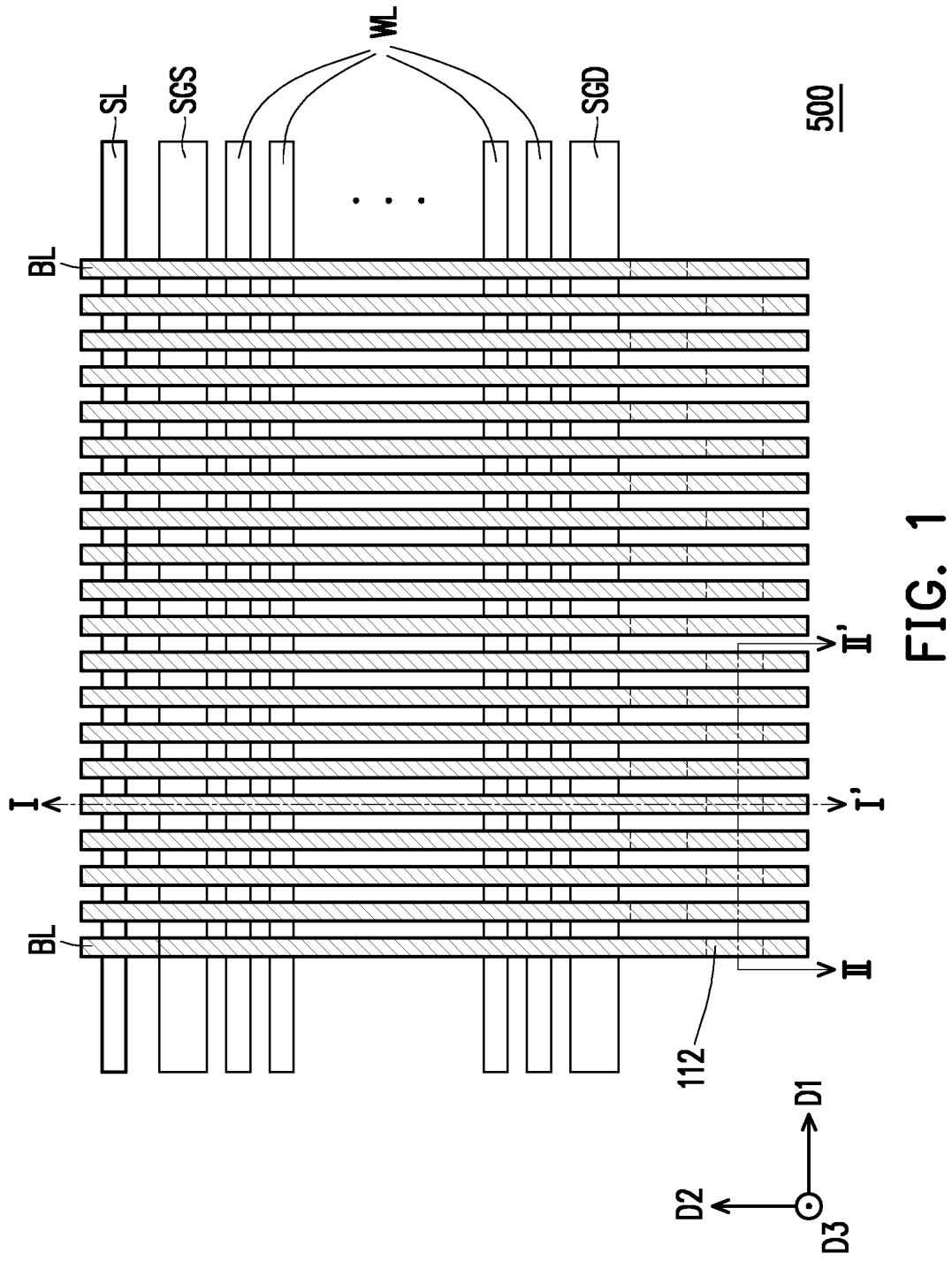
FIG. 1 illustrates a semiconductor device according to some embodiments the disclosure.
Figure 2A:
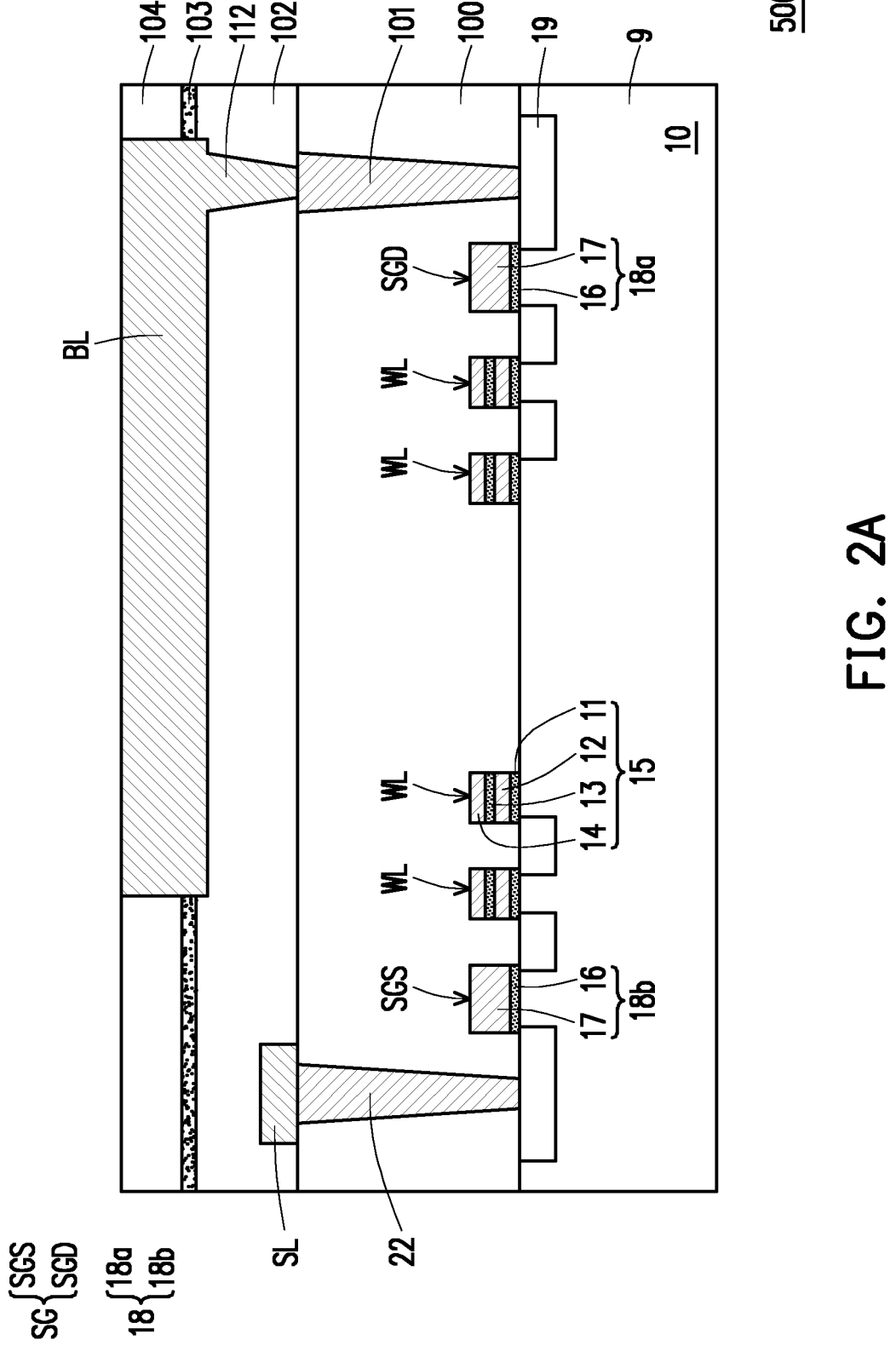
FIG. 2A illustrates a cross-sectional view of a semiconductor device taken along line I-I' of FIG. 1.
Figure 2B:
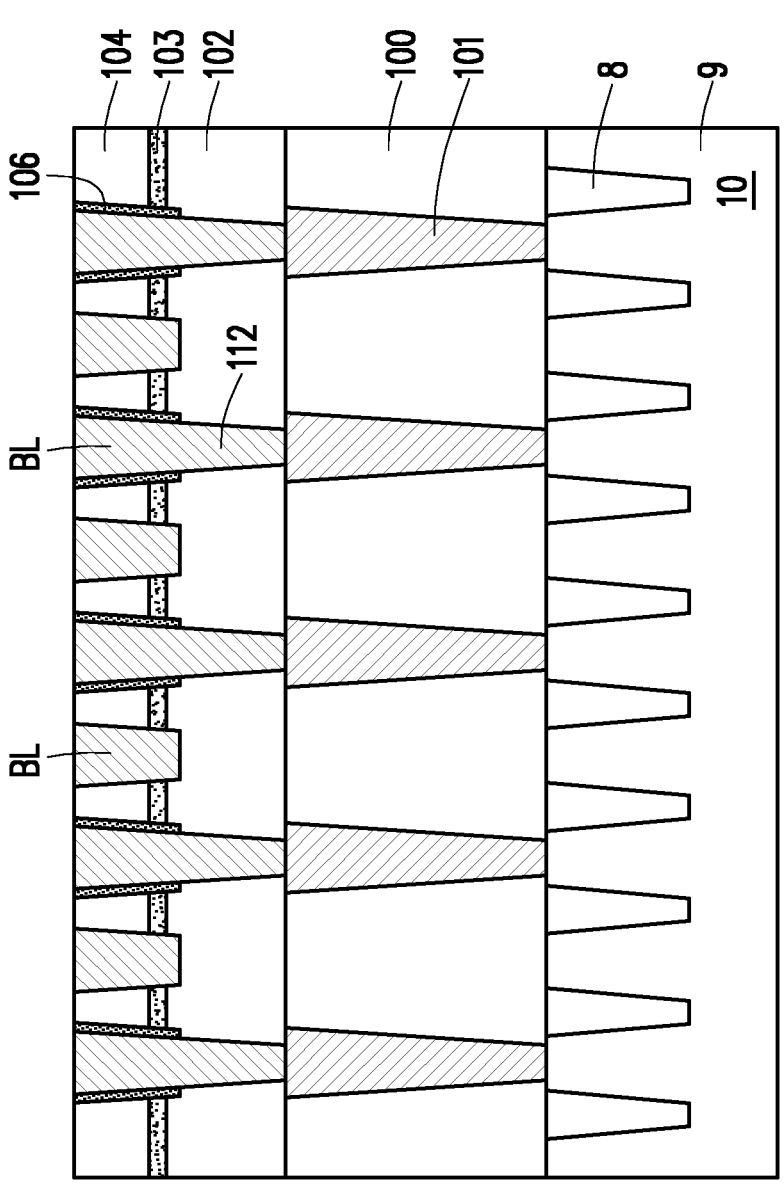
FIG. 2B illustrates a cross-sectional view of a semiconductor device taken along line II-II' of FIG. 1.

FIG. 1 illustrates a semiconductor device 500 according to some embodiments of the disclosure. FIG. 2A illustrates a cross-sectional view of the semiconductor device 500 taken along line I-I' of FIG. 1. FIG. 2B illustrates a cross-sectional view of the semiconductor device 500 taken along line II-II' of FIG. 1.

Referring to FIGS. 1, 2A and 2B, the semiconductor device 500 may be or include a memory device, such as a flash memory device. As shown in FIGS. 2A and 2B, the semiconductor device 500 includes a substrate 10. The substrate 10 includes a plurality of isolation structures 8 (shown in FIG. 2B) and active regions 9 defined by the isolation structures 8. In some embodiments, the isolation structure 8 may include a shallow trench isolation (STI) structure.

As shown in FIG. 2A, a plurality of gate structures 15 and 18 are disposed on the active region 9 of the substrate 10. The gate structure 15 may include a tunneling dielectric layer 11, a floating gate 12, an inter-gate dielectric layer 13, and a control gate 14. The gate structure 18 includes, for example, a gate dielectric layer 16 and a select gate 17. The gate structure 18 may also be referred to as a select gate structure. In some embodiments, the gate structures 18 includes a gate structure 18a and a gate structure 18b, and a plurality of gate structures 15 may be disposed between the gate structure 18a and the gate structure 18b. The materials of the floating gate 12, the control gate 14 and the select gate

US 12,615,770 B2

3                    4

17 may respectively include polysilicon, metal or metal alloy, such as copper, aluminum, tungsten or alloys thereof. The materials of the tunneling dielectric layer 11, the inter-gate dielectric layer 13, and the gate dielectric layer 16 respectively include a suitable dielectric material, such as silicon oxide, silicon nitride, silicon oxynitride, or combinations thereof.

A plurality of source/drain regions 19 are disposed in the substrate 10 and located on sides of the plurality of gate structures 15 and 18. Some of the source/drain regions 19 may be located between the gate structure 15 and the gate structure 18, and serve as common source/drain regions for the gate structures 15 and 18. The source/drain region 19 may be a doped region located in the substrate 10, and may include a P-type dopant or an N-type dopant. A dielectric layer 100 is disposed on the substrate 10. The dielectric layer 100 may also be referred to as an interlayer dielectric layer. The dielectric layer 100 covers the sidewalls and top surfaces of the gate structures 15 and the gate structures 18, and may be a single-layer or a multi-layer structure. The conductive contacts 101 and 22 are embedded in the dielectric layer 100 and electrically connected to the source/drain regions 19 of the gate structures 18a and 18b, respectively. The conductive contacts 101 and 22 may also be referred to as source/drain contacts, the source line SL is disposed on the conductive contact 22, and electrically connected to the source/drain region 19 of the gate structure 18b through the conductive contact 22.

The dielectric layer 102, the etching stop layer 103, the dielectric layer 104, and the dielectric layer 106 (FIG. 2B) are disposed over the dielectric layer 100. A bit line BL and a conductive contact 112 are embedded in the dielectric layer 102, the etching stop layer 103, the dielectric layer 104, and the dielectric layer 106 and are electrically connected to the conductive contact 101, the bit line BL and the conductive contact 112 are integrally formed, and there is free of interface between the bit line BL and the conductive contact 112. The formation method and structural features of the bit line BL and the conductive contact 112 will be described in detail below.

The control gates 14 serve as word lines WL, and the select gates 17 serve as select gate lines SG. The select gate lines SG may include a select gate line SGD and a select gate line SGS. For example, the select gate 17 of the gate structure 18a may serve as the select gate line SGD, and the select gate 17 of the gate structure 18b may serve as the select gate line SGS.

Referring to FIGS. 1 and 2A, a plurality of select gate lines SGS and SGD and a plurality of word lines WL are arranged as side by side, and may extend parallel to each other along a direction D1. A plurality of word lines WL may be located between the select gate line SGS and the select gate line SGD. The source line SL is connected to the source/drain region 19 on a side of the select gate line SGS, and may extend along the direction D1. In some embodiments, the bit line BL is located above the select gate lines SG and the word lines WL, and extends along a direction D2. The direction D1 and the direction D2 are, for example, parallel to the top surface of the substrate 10, and the direction D2 may be perpendicular to the direction D1. The conductive contact 112 is located underlying the bit line BL, and extends from the bottom of the bit line BL to the conductive contact 101 along a direction D3. The direction D3 is, for example, perpendicular to the top surface of the substrate 10.

FIGS. 3, 4A, 4B, 8A and 8B are cross-sectional views and corresponding plan views or top views illustrating multiple intermediate stages in the manufacturing method of the bit line BL and the conductive contact 112 of the semiconductor devices 500. For brevity and clarity, FIG. 3 to FIGS. 8A/8B merely illustrate a portion of the semiconductor device 500, and some components (e.g., the substrate 10, the gate structure 15/18, etc.) are omitted in FIG. 3 to FIGS. 8A/8B.

Figure 3:
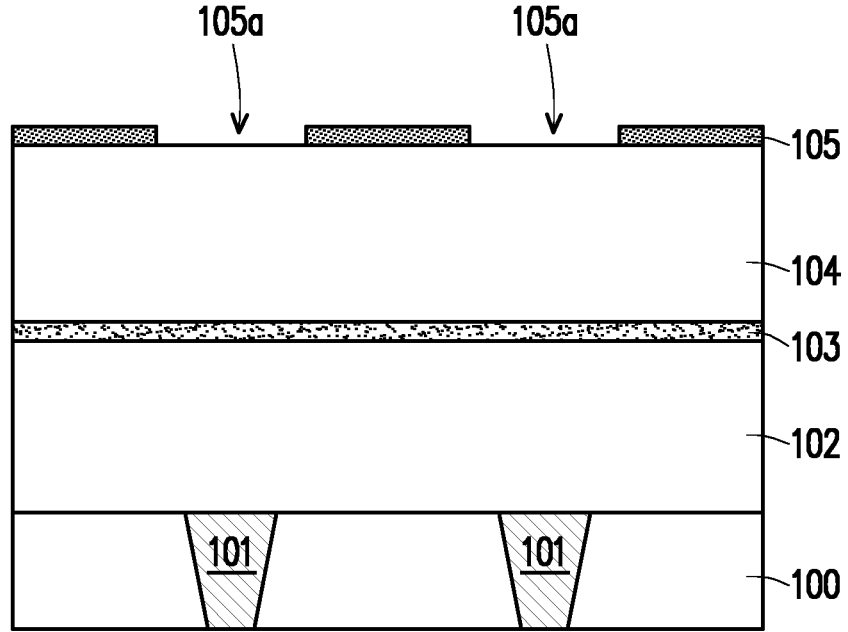

Referring to FIG. 3, a dielectric layer 100 is formed on the substrate 10 (FIG. 2A). Conductive contacts 101 are formed in the dielectric layer 100. The conductive contacts 101 penetrate through the dielectric layer 100 to be electrically connected to the source/drain regions 19 (FIG. 2A) in the substrate underlying the dielectric layer 100. The material of the conductive contact 101 may include metal or metal alloy, such as copper, tungsten, aluminum, alloys thereof, or combinations thereof. In some embodiments, the formation of the conductive contacts 101 may include the following processes: the dielectric layer 100 is patterned by photo-lithograph and etching processes, so as to form via holes in the dielectric layer 100, and then a metal material is formed on the dielectric layer 100 to fill the via holes through a suitable deposition process (e.g., CVD, physical vapor deposition (PVD)). Thereafter, a planarization process is performed to remove excess metal material over the top surface of the dielectric layer 100. The metal material remaining in the via holes form the conductive contacts 101. In some embodiments, the top surfaces of conductive contacts 101 are substantially level with the top surface of dielectric layer 100.

Still referring to FIG. 3, a dielectric layer 102, an etching stop layer 103, and a dielectric layer 104 are sequentially formed on the dielectric layer 100 and the conductive contacts 101, and may be formed through suitable deposition processes, respectively. The materials of the dielectric layer 102 and the dielectric layer 104 are similar to the material of the dielectric layer 100, and the materials of the dielectric layers 100, 102, 104 may be the same as or different from each other. The material of the etching stop layer 103 is different from the materials of the dielectric layers 102 and 104. For example, the etching stop layer 103 includes a dielectric material, such as silicon nitride, silicon oxynitride or the like. In some embodiments, the materials of the dielectric layers 102 and 104 include silicon oxide, while the material of the etching stop layer 103 includes silicon nitride.

A patterned mask layer 105 is formed on the dielectric layer 104. The patterned mask layer 105 includes, for example, a patterned photoresist. The patterned mask layer 105 has a plurality of mask openings 105a, exposing portions of the top surface of the dielectric layer 104. In some embodiments, the plurality of mask openings 105a are respectively located at corresponding positions directly above the conductive contacts 101, and the size (e.g., width, area) of the mask opening 105a is larger than the top size of the corresponding conductive contact 101.

Figure 4A:
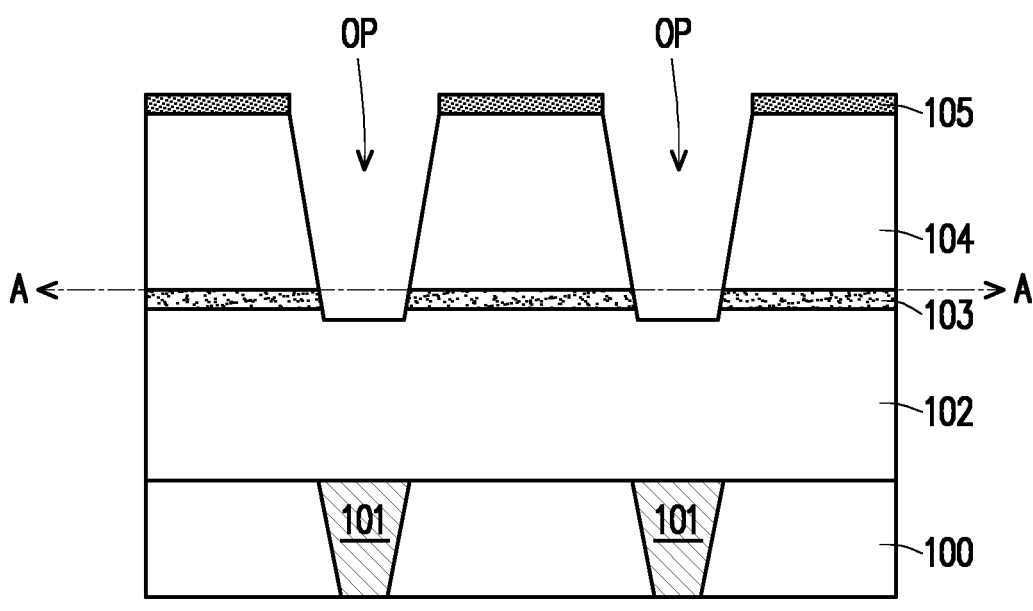

Referring to FIG. 4A, the dielectric layer 104, the etching stop layer 103, and/or the dielectric layer 102 are patterned to form openings OP. The patterning includes performing etching process(es) using the patterned mask layer 105 as an etching mask, so as to remove portions of the dielectric layer 104, the etching stop layer 103, and/or the dielectric layer 102 exposed by the mask openings 105a, and openings OP are formed in the dielectric layer 104, the etching stop layer 103, and/or the dielectric layer 102. In other words, the openings 105a of the patterned mask layer 105 are transferred into the dielectric layer 104, the etching stop layer 103, and/or the dielectric layer 102, so as to form the openings OP.

The opening OP at least extends through the dielectric layer 104 and the etching stop layer 103, and may further extends into the dielectric layer 102. In some embodiments, the etching process stops in the dielectric layer 102, such that the bottom surface of the opening OP exposes the dielectric layer 102 and is lower than the topmost surface of the dielectric layer 102, the etching process stops when the etching stop layer 103 is removed, and the top surface of the dielectric layer 102 is just exposed, that is, the etching process may not remove the dielectric layer 102, and the bottom surface of the opening OP may be substantially level with the bottom surface of the etching stop layer 103. In other words, the sidewalls of the opening OP expose the dielectric layer 104, the etching stop layer 103, and/or the dielectric layer 102. The bottom surface of the opening OP exposes the dielectric layer 102. In some embodiments, the opening OP has an inclined sidewall, and the size (e.g., width) of the opening OP may gradually decrease from top to bottom, but the disclosure is not limited thereto. In alternative embodiments, the opening OP may have a substantially vertical sidewall, that is, the opening OP may have a uniform size (e.g., width) from top to bottom.

Figure 4B:
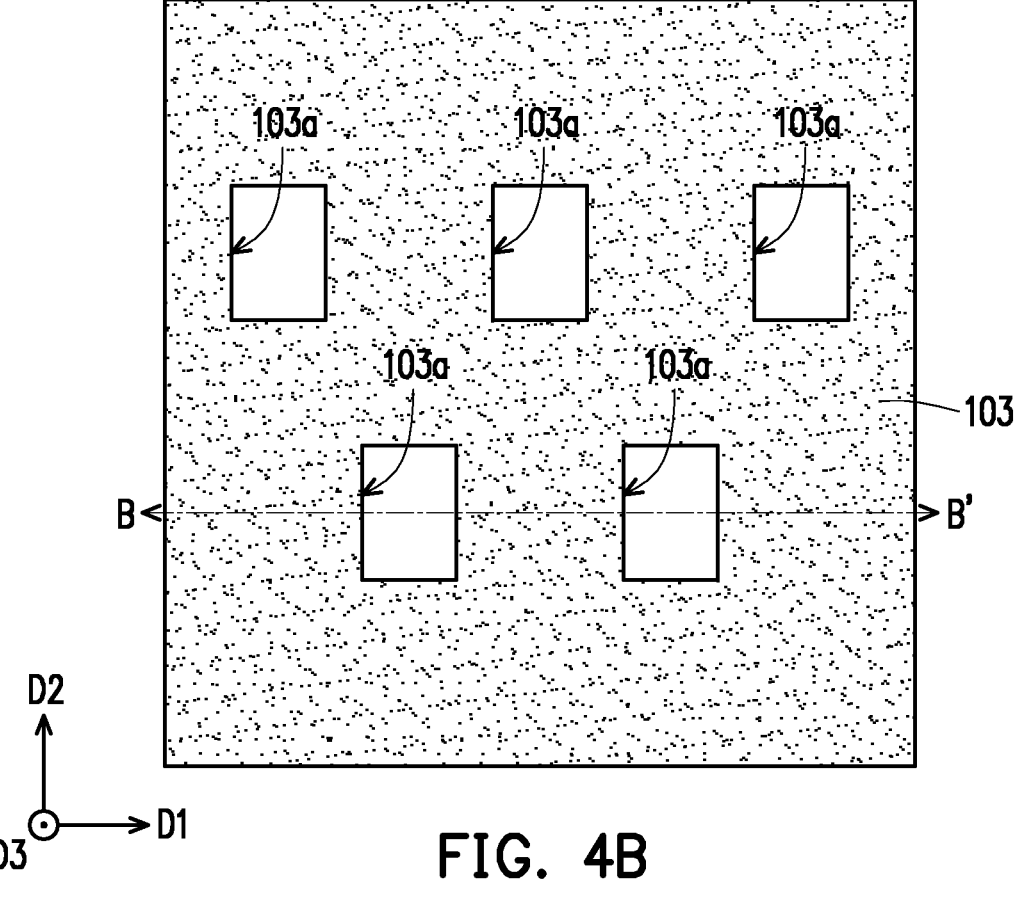

FIG. 4B illustrates a plan view along line A-A' of FIG. 4A, that is, a top view of the etching stop layer 103. FIG. 4A is a cross-sectional view taken along line B-B' of FIG. 4B. As shown in FIG. 4B, a plurality of openings 103a are located in the etching stop layer 103. The opening 103a is a portion of the opening OP defined by the sidewalls of the etching stop layer 103. In some embodiments, a plurality of openings 103a may be arranged as an array, and the openings 103a in two adjacent rows may be arranged in a staggered manner. In other words, the etching stop layer 103 is opened, and has a plurality of openings 103a defined by the sidewalls thereof.

Figure 5A:
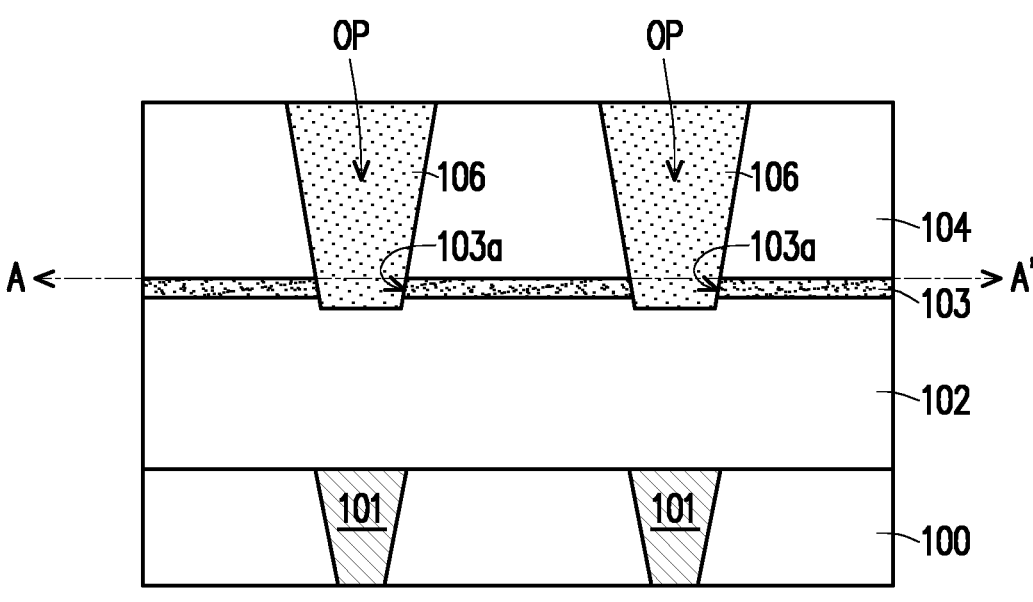

Referring to FIGS. 4A and 5A, the patterned mask layer 105 is removed, and a dielectric layer 106 is then filled in the openings OP. The dielectric layer 106 may also be referred to as an additional dielectric layer. The material of the dielectric layer 106 is similar to, and may be the same as or different from the materials of the dielectric layers 104 and 102, and is different from the material of the etching stop layer 103, the dielectric layer 106 includes silicon oxide. The formation of the dielectric layer 106 may include the following process: after the patterned mask layer 105 is removed, a dielectric material is formed through a suitable deposition process. The dielectric material may be formed to fill the openings OP and cover the top surface of the dielectric layer 104. In some embodiments, a planarization process (e.g., a chemical mechanical polishing (CMP) process) is then performed to remove the dielectric material on the top surface of the dielectric layer 104, and the dielectric material remaining in the openings OP form the dielectric layer 106, the top surface of the dielectric layer 106 is substantially level with the top surface of the dielectric layer 104. However, the disclosure is not limited thereto. In some alternative embodiments, the planarization process does not completely remove the dielectric material on the top surface of the dielectric layer 104, such that the dielectric layer 106 fills in the openings OP and extends to cover the top surface of the dielectric layer 104.

Figure 5B:
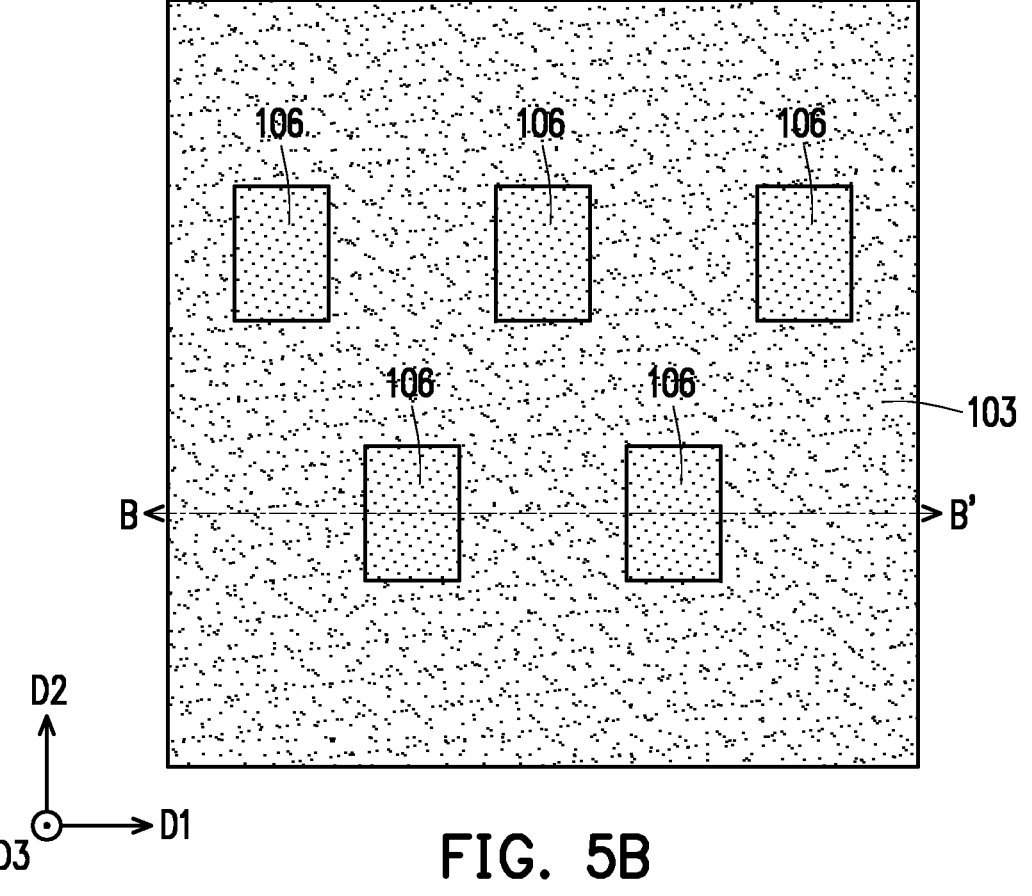

FIG. 5B illustrates a plan view taken along line A-A' of FIG. 5A, that is, a top view of the etching stop layer 103 and a portion of dielectric layer 106. FIG. 5A is a cross-sectional view taken along line B-B' of FIG. 5B. Referring to FIGS. 5A and 5B, the dielectric layer 106 is located on the dielectric layer 102 and is laterally surrounded by the dielectric layer 104, the etching stop layer 103, and/or the dielectric layer 102. The sidewall of the dielectric layer 106 is in contact with the dielectric layer 104, the etching stop layer 103, and/or the dielectric layer 102, and the bottom surface of the dielectric layer 106 is in contact with the dielectric layer 102. In other words, the openings 103a of the opened etching stop layer 103 is filled by the dielectric layer 106.

Figure 6A:
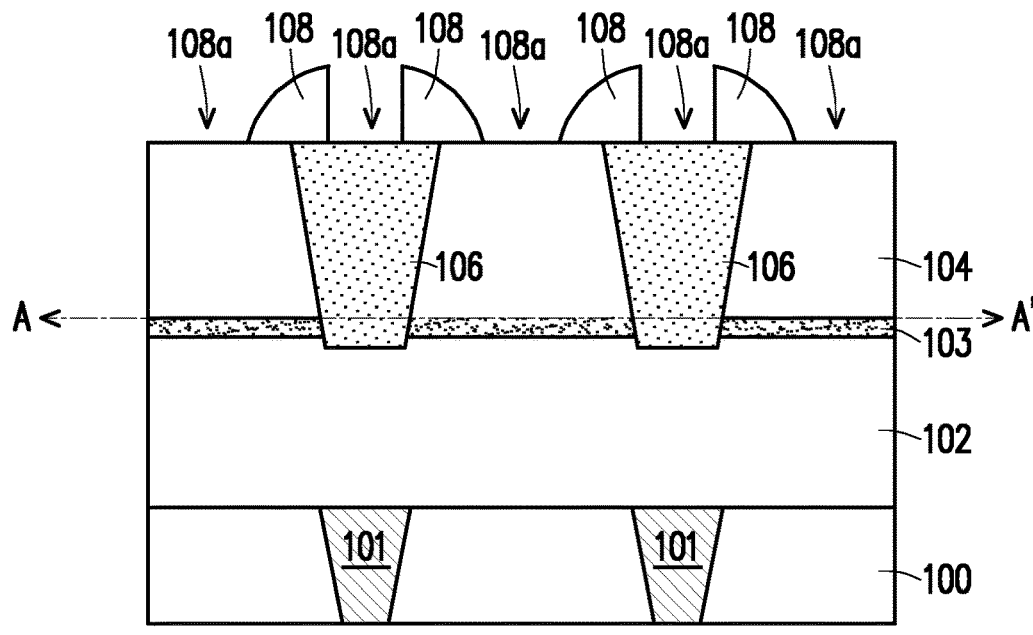
FIG. 6A is a cross-sectional view taken along line B-B' of FIG. 6B.

Referring to FIG. 6A, a mask layer 108 is formed on the dielectric layers 104 and 106, the forming method of the mask layer 108 may include a multi-patterning process, such as a self-aligned double patterning (SADP) process. For example, the formation of the mask layer 108 includes the following process: a plurality of photoresist patterns are formed on the dielectric layers 104 and 106 by a photolithograph process. Then, a hard mask layer is formed on the dielectric layer 104/106 to cover the photoresist patterns. Thereafter, an etching back process is performed to remove portions of the hard mask layer, and the remaining portions of the hard mask layer covering the sidewalls of the photoresist patterns form spacers of the photoresist patterns. The photoresist patterns are then removed, and the spacers constitute the mask layer 108.

Figure 6B:
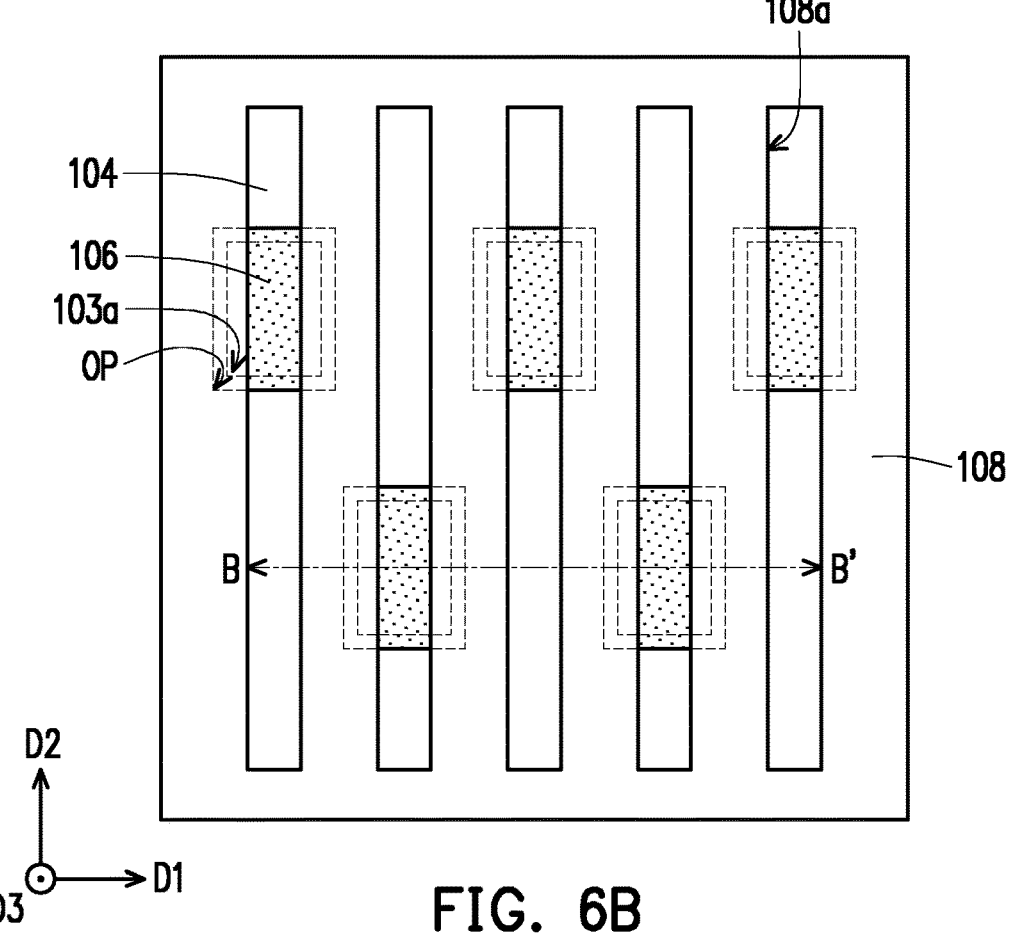
FIG. 6B is a top view of FIG. 6A.

FIG. 6B is a top view of FIG. 6A. FIG. 6A is a cross-sectional view taken along line B-B' of FIG. 6B.

Referring to FIGS. 6A and 6B, the mask layer 108 has a plurality of mask openings 108a, the plurality of openings 108a are, for example, a plurality of trenches extending in parallel along the direction D2. Each opening 108a exposes a portion of the top surface of the dielectric layer 106 and a portion of the top surface of the dielectric layer 104, and a portion of the opening 108a is located directly above the conductive contact 101 and the opening 103a of the etching stop layer 103. In other words, the opening 108a is overlapped with the opening 103a of the etching stop layer 103 and the conductive contact 101 in the direction D3. In some embodiments, the width of the opening 108a is not greater than (e.g., less than or substantially equal to) the width of the opening 103a. Herein, the width of the opening 108a and the width of the opening 103a refer to their width along the direction D1.

Figure 7A:
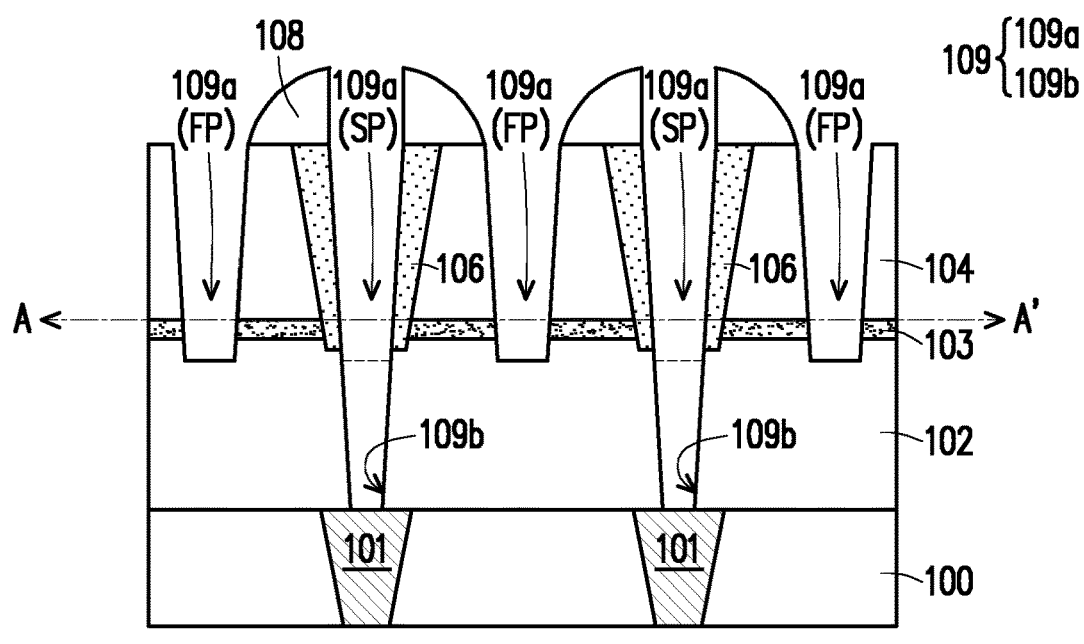

Referring to FIG. 7A, the dielectric layer 104, the dielectric layer 106, the etching stop layer 103, and the dielectric layer 102 are patterned to form trenches 109a and via holes 109b. The patterning includes performing etching process (es) using the mask layer 108 as an etching mask, so as to remove portions of the dielectric layer 104, the dielectric layer 106, the etching stop layer 103, and the dielectric layer 102 exposed by the opening 108a, and a plurality of openings 109 are formed, each opening 109 includes a trench 109a and a via hole 109b underlying the trench 109a, which are spatially connected to each other. The trench 109a may also be referred to as a bit line trench.

The plurality of trenches 109a extend in parallel along the direction D2, and the plurality of via holes 109b respectively extend from the bottoms of the trenches 109a downward along the direction D3, and extend to expose the top surfaces of the conductive contacts 101. The trench 109a includes a first portion FP and a second portion SP that are adjacent to and connected to each other. The first portion FP extends at least through the dielectric layer 104 and the etching stop layer 103, and may further extends into the dielectric layer 102. The bottom surface of the first portion FP exposes the dielectric layer 102. The second portion SP and the via hole 109b are in spatial communication with each other, and penetrate through the dielectric layer 106 and the dielectric layer 102 to expose the top surface of the conductive contact 101.

The formation of the opening 109 includes removing portions of the dielectric layer 104, the etching stop layer 103, and the dielectric layer 102 exposed by the mask openings 108*a* to form the first portions FP of the trenches 109*a*. The formation of the openings 109 further include removing portions of the dielectric layer 106 and the dielectric layer 102 underlying thereof that are exposed by the mask openings 108*a* to form the second portions SP of the trenches 109*a* and the via holes 109*b*, the etchant used for the etching process has a high etching selectivity ratio of the dielectric layer 106, 104, 102 (e.g., silicon oxide) to the etching stop layer 103 (e.g., silicon nitride). For example, the etching process has substantially the same etching rate (e.g., a first etching rate) for the dielectric layer 106/104/102. The etching process has a second etching rate for the etching stop layer 103, and the second etching rate may be much lower than the first etching rate.

During the etching process, forming the first portions FP of the trenches 109*a* needs to remove the etching stop layer 103, while forming the second portions SP of the trenches 109*a* and the via holes 109*b* do not need to remove the etching stop layer 103. Therefore, while the etching stop layer 103 is being removed to form the first portions FP of the trenches 109*a*, the etching process removes the dielectric layers 106 and 102 at a faster etching rate, thereby forming the second portions BP of the trenches 109*a* and downwardly forming deeper via holes 109*b*, when the etching process is stopped, the via holes 109*b* extend to expose the top surfaces of the conductive contacts 101, and the trenches 109*a* extend to expose the dielectric layer 102. The bottom surface of trench 109*a* may be substantially level with the bottom surface of the etching stop layer 103 or lower than the topmost surface of the dielectric layer 102.

Figure 7B:
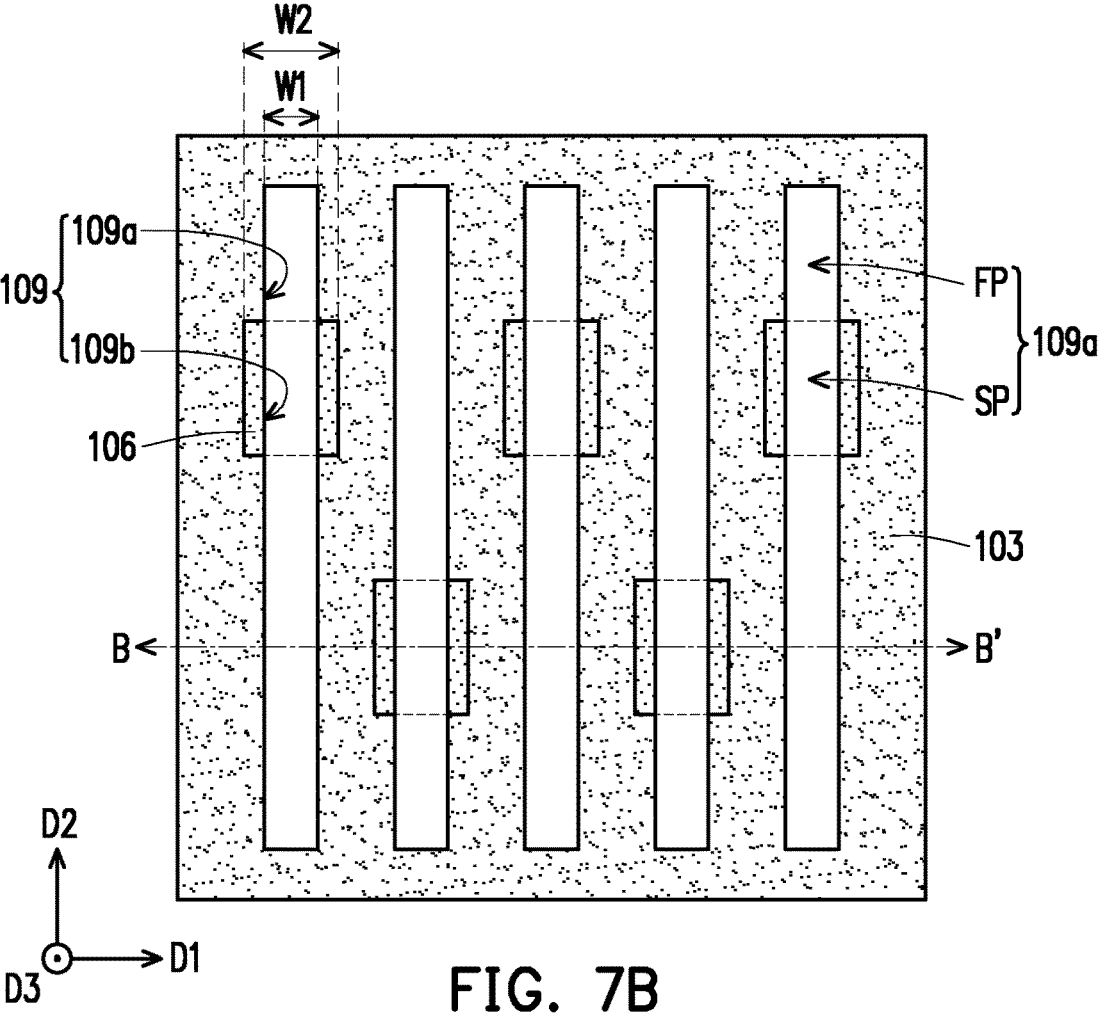

FIG. 7B illustrates a plan view along the line A-A' of FIG. 7A. FIG. 7A is a cross-sectional view taken along line B-B' of FIG. 7B. As shown in FIG. 7A and FIG. 7B, the portions of the dielectric layer 106 embedded in the etching stop layer 103 are removed. In some embodiments, the width W1 of the trench 109*a* is smaller than the width W2 of the dielectric layer 106, and the remaining portions of the dielectric layer 106 is located on opposite sides of the trench 109*a* and may be separated by the trench 109*a*. The second portion SP of trench 109*a* is located in the dielectric layer 106 and is at least defined by the sidewalls of the dielectric layer 106.

Figure 8A:
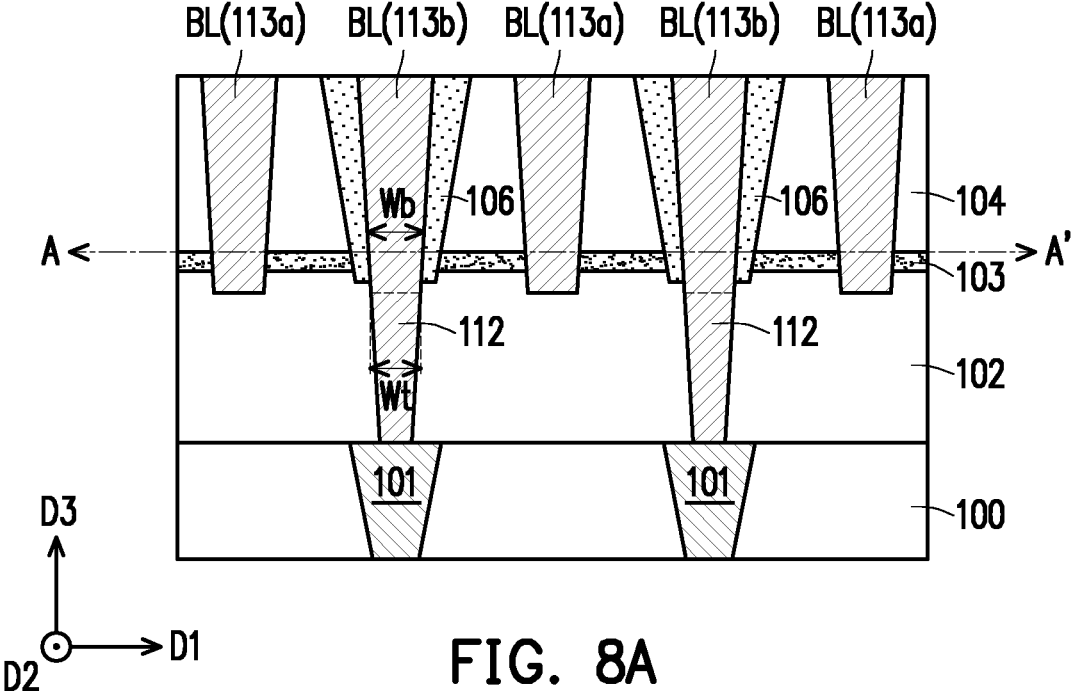

Referring to FIG. 8A, the mask layer 108 is removed, and bit lines BL and conductive contacts 112 are formed in the trenches 109*a* and the via holes 109*b*, the material of the bit line BL and the conductive contact 112 may include metal or metal alloy, such as copper, aluminum, tungsten, alloys thereof, or combinations thereof. In some embodiments, the formation of the bit lines BL and the conductive contacts 112 includes the following process: after the mask layer 108 is removed, a conductive material is formed on the dielectric layer 104/106 to fill the trenches 109*a* and via holes 109*b*, using a suitable deposition process; thereafter, a planarization process is performed to remove excess portions of the conductive material above the top surfaces of the dielectric layer 104/106, and the remaining conductive material in the trenches 109*a* forms the bit lines BL, while the remaining conductive material in the via holes 109*b* form the conductive contacts 112, the top surfaces of the bit lines BL are substantially level with the top surfaces of the dielectric layer 106 and the dielectric layer 104.

Figure 8B:
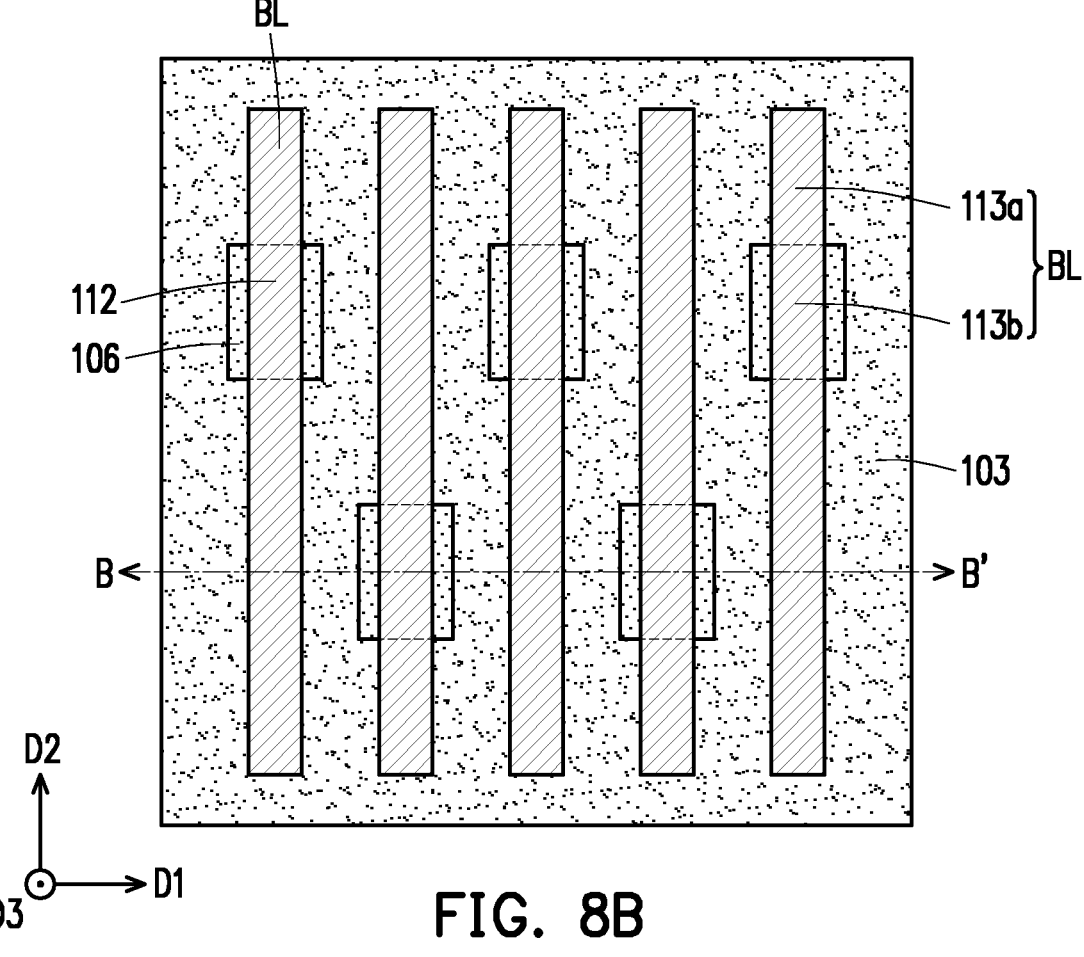

FIG. 8B illustrates a plan view along line A-A' of FIG. 8A. FIG. 8A is a cross-sectional view taken along line B-B' of FIG. 8B.

Referring to FIGS. 8A and 8B, a plurality of bit lines BL extend parallel to each other along the direction D2. The conductive contact 112 is located between the bit line BL and the conductive contact 101 to electrically connect the bit line BL to the conductive contact 101. Each bit line BL includes a first portion 113*a* and a second portion 113*b*. The first portion 113*a* is located in the dielectric layer 104, the etching stop layer 103, and/or the dielectric layer 102. In some embodiments, the bottom surface of the first portion 113*a* is in contact with the dielectric layer 102, and may be substantially level with or lower than the bottom surface of the etching stop layer 103 (or level with or lower than the topmost surface of the dielectric layer 102). The sidewalls of the first portion 113*a* are in physical contact with the dielectric layer 104, the etching stop layer 103 and/or the dielectric layer 102. The second portion 113*b* of the bit line BL is located in the dielectric layer 106 and may further extends into the dielectric layer 102. The bottom surface (shown as a dotted line in FIG. 8A) of the second portion 113*b* is substantially level with the bottom surface of the first portion 113*a*, and is in contact with the conductive contact 112. The sidewalls of the second portion 113*b* are surrounded by and in physical contact with the dielectric layer 106. In some embodiments, the second portion 113*b* is separated from the dielectric layer 104 and the etching stop layer 103 by the dielectric layer 106 therebetween. The bottom surface of the bit line BL may be higher than, substantially level with, or lower than the bottom surface of the dielectric layer 106. The conductive contact 112 is embedded in and laterally surrounded by the dielectric layer 102. In some embodiments, the conductive contact 112 may be embedded in both the dielectric layer 102 and the dielectric layer 106, and the sidewall of the conductive contact 112 may be in contact with both the dielectric layer 102 and the dielectric layer 106.

The bit line BL and the conductive contact 112 are integrally formed. There is free of interface between the bit line BL and the conductive contact 112. The top width Wt of the conductive contact 112 is not greater than the bottom width Wb of the bit line BL. In some embodiments, the top width Wt of the conductive contact 112 is actually equal to the bottom width Wb of the bit line BL. It is noted that, the top width Wt of the conductive contact 112 and the bottom width Wb of the bit line BL described herein refer to their width along the direction D1.

The bit line and the conductive contact are simultaneously formed by forming the bit line trench and the via hole through one etching process, and then filling a conductive material into the bit line trench and the via hole. As such, the bit line and the conductive contact are integrally formed, which may avoid or reduce the risk of short circuit between the conductive contact and a bit line adjacent to the bit line overlying the conductive contact. In addition, the etching process and the depth of the via hole may be better controlled by adjusting the thickness of the etching stop layer.

Although the disclosure has been disclosed as embodiment as above, it is not intended to limit the disclosure. It will be apparent to those skilled in the art that various modifications and variations can be made to the disclosed embodiments without departing from the scope or spirit of the disclosure. The scope of protection of the invention shall be subject to the scope of the attached claims.

What is claimed is:

1. A method of forming a semiconductor device, comprising:

forming a first dielectric layer;

forming an etching stop layer on the first dielectric layer;

forming a second dielectric layer on the etching stop layer;

forming a first patterned mask layer on the second dielectric layer;

patterning the second dielectric layer and the etching stop layer by using the first patterned mask layer as an etching mask to form an opening in the second dielectric layer and the etching stop layer;

removing the first patterned mask layer;

forming an additional dielectric layer in the opening;

forming a second patterned mask layer on the second dielectric layer and the additional dielectric layer, wherein the second patterned mask layer has a mask opening to expose a portion of a top surface of the second dielectric layer, and a portion of a top surface of the additional dielectric layer, and the mask opening is disposed directly above a portion of the additional dielectric layer that is embedded in the etching stop layer;

performing an etching process according to the second patterned mask layer to remove portions of the second dielectric layer, the additional dielectric layer, the etching stop layer, and the first dielectric layer, thereby forming a bit line trench in the first dielectric layer, the second dielectric layer, the etching stop layer and the additional dielectric layer and a via hole in the first dielectric layer;

removing the second patterned mask layer; and filling a conductive material in the bit line trench and the via hole, to form a bit line in the bit line trench and a conductive contact in the via hole.

2. The method of forming the semiconductor device of claim 1, wherein a width of the mask opening is smaller than a width of the portion of the additional dielectric layer.

3. The method of forming the semiconductor device of claim 1, wherein the etching process comprises:

removing a portion of the second dielectric layer and a portion of the etching stop layer underlying thereof, so as to form a first portion of the bit line trench; and removing a portion of the additional dielectric layer and a portion of the first dielectric layer underlying thereof, so as to form a second portion of the bit line trench and the via hole underlying the second portion of the bit line trench.

4. The method of forming the semiconductor device of claim 3, wherein the first portion of the bit line trench further extends into the first dielectric layer, such that a bottom surface of the first portion of the bit line exposes the first dielectric layer.

5. The method of forming the semiconductor device of claim 3, wherein the second portion of the bit line trench and the via hole are in spatial communication with each other, and penetrate through the additional dielectric layer and the first dielectric layer to expose a top surface of the conductive contact.

6. The method of forming the semiconductor device of claim 1, wherein the bit line is electrically connected to a source/drain contact through the conductive contact, and the source/drain contact is connected to the source/drain region of a select gate.

7. The method of forming the semiconductor device of claim 1, wherein a bottom surface of the opening is substantially level with a bottom surface of the etching stop layer.

8. The method of forming the semiconductor device of claim 1, wherein the opening further extends into the first dielectric layer, such that a bottom surface of the opening exposes the first dielectric layer and is lower than a topmost surface of the first dielectric layer.

9. The method of forming the semiconductor device of claim 1, wherein the bit line extends in a first direction, a top width of the conductive contact is not greater than a bottom width of the bit line, the top width and the bottom width are along a second direction which is perpendicular to the first direction.

10. The method of forming the semiconductor device of claim 1, wherein the bit line and the conductive contact are integrally formed.

11. The method of forming the semiconductor device of claim 1, wherein each bit line includes a first portion and a second portion, the first portion of the each bit line is located in the second dielectric layer and the etching stop layer, and the second portion of the each bit line is located in the additional dielectric layer and further extends into the first dielectric layer.

12. The method of forming the semiconductor device of claim 11, wherein a bottom surface of the first portion of the each bit line is in contact with the first dielectric layer and is substantially level with or lower than a bottom surface of the etching stop layer, and sidewalls of the second portion of the each bit line are surrounded by and in physical contact with the additional dielectric layer.

13. The method of forming the semiconductor device of claim 1, wherein the conductive contact is embedded in and laterally surrounded by the first dielectric layer.

14. The method of forming the semiconductor device of claim 1, wherein the conductive contact is embedded in both the first dielectric layer and the additional dielectric layer, and sidewalls of the conductive contact is in contact with both the first dielectric layer and the additional dielectric layer.

* * * * *